US010031879B2

United States Patent
Eilert et al.

(10) Patent No.: US 10,031,879 B2
(45) Date of Patent: *Jul. 24, 2018

(54) MEMORY DEVICE FOR A HIERARCHICAL MEMORY ARCHITECTURE

(71) Applicant: Micron Technology, Inc., Boise, ID (US)

(72) Inventors: Sean Eilert, Penryn, CA (US); Mark Leinwander, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/489,434

(22) Filed: Apr. 17, 2017

(65) Prior Publication Data

US 2017/0220516 A1    Aug. 3, 2017

Related U.S. Application Data

(63) Continuation of application No. 14/840,733, filed on Aug. 31, 2015, now Pat. No. 9,626,327, which is a continuation of application No. 12/483,198, filed on Jun. 11, 2009, now Pat. No. 9,123,409.

(51) Int. Cl.
*G06F 12/08* (2016.01)
*G06F 13/42* (2006.01)
*H01L 45/00* (2006.01)
*G06F 3/06* (2006.01)

(52) U.S. Cl.
CPC ............ *G06F 13/4247* (2013.01); *G06F 3/06* (2013.01); *G06F 12/08* (2013.01); *H01L 45/06* (2013.01)

(58) Field of Classification Search
CPC ..... G06F 3/0635; G06F 3/0611; G06F 3/0685
See application file for complete search history.

(56) References Cited

U.S. PATENT DOCUMENTS

| 5,504,882 | A | 4/1996 | Chai et al. |
| 5,924,115 | A | 7/1999 | Von Herzen et al. |
| 6,073,209 | A | 6/2000 | Bergsten |
| 9,123,409 | B2 * | 9/2015 | Eilert ................. G11C 13/0004 |

(Continued)

FOREIGN PATENT DOCUMENTS

| CN | 101923447 B | 4/2013 |
| DE | 102009037984 A1 | 12/2010 |

(Continued)

OTHER PUBLICATIONS

"Chinese Application Serial No. 200910171261.9, Office Action dated Jan. 5, 2012", 18 pgs.

(Continued)

*Primary Examiner* — Edward J Dudek, Jr.
(74) *Attorney, Agent, or Firm* — Schwegman Lundberg & Woessner, P.A.

(57) ABSTRACT

In various embodiments, a hierarchical memory device having multiple interfaces with different memory formats includes a Phase Change Memory (PCM). An input port and an output port connect the hierarchical memory device in a daisy-chain hierarchy and/or a hierarchical tree structure with other memories. Standard non-hierarchical memory devices can also attach to the output port of the hierarchical memory device. Other embodiments are discussed.

20 Claims, 4 Drawing Sheets

(56) References Cited

U.S. PATENT DOCUMENTS

| | | | |
|---|---|---|---|
| 9,626,327 B2* | 4/2017 | Eilert | G06F 13/4247 |
| 2005/0286336 A1 | 12/2005 | Harari et al. | |
| 2006/0274566 A1 | 12/2006 | Takashima et al. | |
| 2007/0130442 A1 | 6/2007 | Lee et al. | |
| 2008/0229003 A1 | 9/2008 | Mizushima et al. | |
| 2008/0229026 A1 | 9/2008 | Chung | |
| 2008/0270811 A1 | 10/2008 | Chow et al. | |
| 2008/0313364 A1 | 12/2008 | Flynn et al. | |
| 2010/0318718 A1 | 12/2010 | Eilert et al. | |
| 2012/0144102 A1 | 6/2012 | Langlois et al. | |
| 2015/0370750 A1 | 12/2015 | Eilert et al. | |

FOREIGN PATENT DOCUMENTS

| | | | |
|---|---|---|---|
| JP | 2006338370 A | | 12/2006 |
| JP | 2008097237 A | | 4/2008 |
| JP | 2008226149 A | | 9/2008 |
| JP | 2009517725 A | | 4/2009 |
| WO | WO-2008121559 A1 | | 10/2008 |
| WO | WO-2009000857 A1 | | 12/2008 |

OTHER PUBLICATIONS

"Chinese Application Serial No. 200910171261.9, Office Action dated Apr. 20, 2012", With English Translation, 10 pgs.

"Chinese Application Serial No. 200910171261.9, Office Action dated Jul. 9, 2012", 9 pgs.

"Chinese Application Serial No. 200910171261.9, Response filed Mar. 2, 2012 to Office Action dated Jan. 5, 2012", 13 pgs.

"Chinese Application Serial No. 200910171261.9, Response filed Sep. 24, 2012 to Office Action dated Jul. 9, 2012", 18 pgs.

"German Application Serial No. 102009037984.3, Office Action dated Apr. 26, 2012", 9 pgs.

"German Application Serial No. 102009037984.3, Office Action dated Nov. 19, 2013", 5 pgs.

"German Application Serial No. 102009037984.3, Response filed Oct. 31, 2012 to Office Action dated Apr. 26, 2012", 26 pgs.

"Japanese Application Serial No. 2009-217985, Office Action dated Mar. 4, 2013", 6 pgs.

"Japanese Application Serial No. 2009-217985, Office Action dated Jul. 1, 2013", 8 pgs.

"Japanese Application Serial No. 2009-217985, Response filed Jun. 4, 2013 to Office Action dated Mar. 4, 2013", 8 pgs.

Greenberg, Marc, "Lower voltage next goal for low-power DDR", (Jun. 9, 2008), 1-2.

Hopkin, Brian, "What is the Difference Between DDR1, DDR2 & DDR3?—The Complete Idiot's Guide", (Oct. 2, 2008), 1-2.

Murray, Matthew, "DDR vs. DDR2 vs. DDR3: Types of RAM Explained", [Online]. Retrieved from the Internet: <URL: htp://www.pcmag.com/article2/0,2817,2400801,00.asp>, (Feb. 28, 2012), 5 pgs.

"Chinese Application Serial No. 2009101712619, Response filed Jun. 12, 2012 to Office Action dated Apr. 20, 2012", w/ English claims, 19 pgs.

"German Application Serial No. 102009037984.3, Response filed Apr. 17, 2014 to Office Action dated Nov. 19, 2013", w/English Claims, 20 pgs.

"Japanese Application Serial No. 2009-217985, Voluntary Amendment filed Sep. 12, 2012", w/English Translation, 5 pgs.

"Korean Application Serial No. 10-2009-0079938 Response filed Apr. 16, 2015 to Office Action dated Jan. 5, 2015", With the English claims, 25 pgs.

"Korean Application Serial No. 10-2009-0079938, Amendment filed Aug. 6, 2014", w/English Translation, 12 pgs.

"Korean Application Serial No. 10-2009-0079938, Office Action dated Aug. 29, 2014", w/English Translation, 9 pgs.

* cited by examiner

MEMORY DEVICE FOR A HIERARCHICAL MEMORY ARCHITECTURE

PRIORITY APPLICATIONS

This application is a continuation of U.S. application Ser. No. 14/840,733, filed Aug. 31, 2015, now issued as U.S. Pat. No. 9,626,327, which is a continuation of U.S. application Ser. No. 12/483,198, filed Jun. 11, 2009, now issued as U.S. Pat. No. 9,123,409, each of which is incorporated herein by reference in its entirety.

BACKGROUND OF THE INVENTION

With current microprocessors the data transaction between the CPU and/or core logic and system memory becomes the bottleneck of system performance. Due to the intrinsic capacitances of system-level buses, a considerable amount of power may be dissipated at the input/output interface of a processor when binary data is transmitted. Simultaneous power and timing optimization to account for bus latency are critical design constraints taken into account to improve system performance. Additional improvements are needed at the interface to mass-storage memory devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
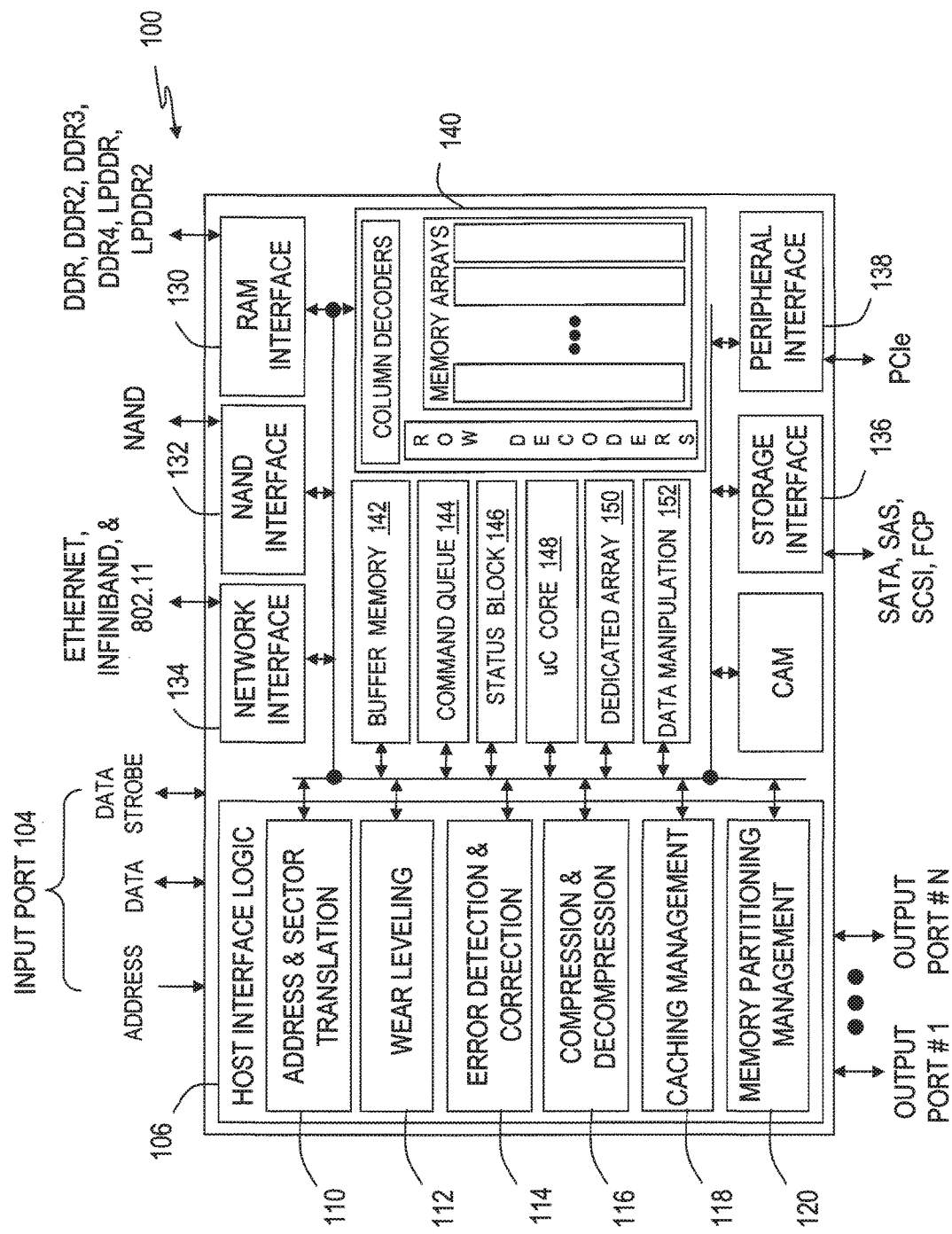
FIG. 1 is a hierarchical memory device that may be used as memory storage in a hierarchical architecture in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

It should be understood that the terms "coupled" and "connected", along with their derivatives, are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

The architecture illustrated in FIG. 1 shows a hierarchical memory device 100 that includes multiple interfaces and a processor core 148 to facilitate communication with other storage devices in a hierarchical arrangement in accordance with the present invention. Bus 104 provides connection to a multiprocessing interface that allow for communication between the processor, any I/O that may be attached, and mixed memory types. High speed communication provided via bus 104 supports direct writes and provides high speed bus transactions. The signals in bus 104 may use various signaling methods. Provided as examples of these signaling methods, bus 104 may provide signals that are single-ended or that use Gunning Transceiver Logic (GTL+) signaling technology having differential input buffers which use a reference level by the receivers to determine if a signal is a logical 0 or a logical 1, although the scope of the present invention is not limited to these examples and other signaling methods may be used.

Memory device 100 includes a Ram Interface 130, a NAND Interface 132, a Network Interface 134, a Storage Interface 136, and a Peripheral Interface 138. RAM Interface 130 provides communication between a host controller and memory device 100 using interface circuitry that selectively operates at increasingly higher multiples of the fundamental read rate. For example, RAM Interface 130 may provide for a serial input of data, or alternatively, provide a higher bandwidth through a synchronous interface that waits for a clock signal before responding to control inputs (Synchronous Dynamic Random Access Memory (SDRAM)).

Ram Interface 130 may also receive data as a Double-Data-Rate Random Access Memory (DDR RAM) or the next generation DDR2. In DDR2 the bus is clocked at twice the speed of the memory cells so DDR2 can effectively operate at twice the bus speed of DDR. Ram Interface 130 may also provide Double-Data-Rate three Synchronous Dynamic Random Access Memory (DDR3 SDRAM) that transfers data at twice the data rate of DDR2, thus enabling even higher bus rates and higher peak rates than earlier memory technologies. Memory device 100 may also adapt to DDR4 that operates the Input/Output (I/O) at 1.2 volts. Hierarchical memory device 100 also supports reduced power interfaces such as Low Power Double-Data-Rate (LPDDR) and LPDDR2 having lower supply voltages.

NAND Interface 132 controls operations in support of connecting NAND memory to a host processor to provide a lower bandwidth, a longer latency, and offer simplicity of design and a reduced pin count relative to Ram Interface 130. Memory block 140 receives data in support of NAND flash that may be used for mass storage applications. Operating in support of NAND flash, memory device 100 performs three basic operations, namely read page, program page, and erase block. In support of the NAND configuration, memory block 140 consists of a set of blocks and pages, where each page has a data part that stores the user data and a spare part that stores meta-data associated with user data, such as ECC information.

Command and operation information is extracted to control NAND Interface 132 and adjust data input and/or output between the NAND interface and the buffer memory 142 based on the command and the address. Data may be output from the NAND Interface 132 to the error correction logic in Error Detection & Configuration 114 for performing error correction on the data. With integrated capabilities memory device 100 can act as a multi-core NAND management subsystem or an autonomous computing subsystem.

Network Interface 134 provides support for Ethernet, Infiniband, and 802.11. The Ethernet is a Local Area Network (LAN) interface that uses a Carrier Sense Multiple Access with Collision Detection (CSMA/CD) method to handle simultaneous demands. The CSMA/CD protocol provides fair access to the shared channel so that connected stations get a chance to use the network. After every packet transmission the CSMA/CD protocol determines which station is granted permission to use the Ethernet channel next. The Ethernet protocol specifies the rules for constructing frames where both a destination address and a source address are specified.

Network Interface 134 supports the point-to-point bidirectional serial link defined as InfiniBand that connects the host processor with high speed peripherals such as, for example, a disk. The interface may support several signaling rates and links. Network Interface 134 may also support 802.11 communication links.

Storage Interface 136 supports industrial and embedded applications. Storage Interface 136 supports a Serial ATA (SATA) storage interface that allows communication between a host bus and mass storage devices. The SATA interface drives a cable with a minimum of four wires to create a point-to-point connection. Another interface supported by Storage Interface 136 is Serial-Attached SCSI (SAS) that is a point-to-point serial interface that links memory device 100 to a disk drive. SAS may be used to enable multiple devices of different sizes and types to be connected to memory device 100 simultaneously using cables. Parallel SCSI interface (PSI, aka SCSI) is one of the interface implementations in the SCSI family that may be supported by memory device 100. Fibre Channel Protocol (FCP) is the interface protocol of SCSI on the Fibre Channel (FC). FC drives are dual-port and include Native Command Queuing (NCQ), a technology that allows an individual hard disk to internally optimize the order in which received read and write commands are executed.

While transactions are being processed by the storage controller, additional logic and registers identify and record various usage pattern parameters such as locality and sequencing information. The storage controller includes logic to identify and adjust storage accesses. The host controller may read this register information and adjust its method of sending transactions to the storage device. Alternatively, the host controller may read the register information and send microcode to the storage device.

Peripheral Interface 138 may be used for consumer, server, and industrial applications; both as a motherboard-level interconnect to link motherboard-mounted peripherals and as an expansion card interface for add-in boards. By way of example, Peripheral Component Interconnect Express (PCI Express or PCIe) allows "channel grouping" where multiple lanes are bonded to a single device pair to provide higher bandwidth. The number of lanes may be "negotiated" during power-up or defined explicitly during operation.

To control memory operations, hierarchical memory device 100 includes a microcontroller (uC) core 148 that integrates counters/timers, an interrupt structure, defines configurable I/O ports, and selects modes of power reduction, amongst other processing functions. By way of example, uC 148 may include an operating mode to activate security features that regulate access requests to contents of locations of program memory. With security activated, concurrent programming, i.e., programming of one area of memory using instructions executing from another area of memory, may be initiated under predetermined secure conditions.

A memory array 150 dedicated to storing configuration information specific to hierarchical memory device 100 may be loaded either by the manufacturer or by the user. Software executed by uC core 148 applies the configuration data to the interface blocks to select various protocols and control the interface configuration of hierarchical memory device 100 that is provided to the host, attached peripheral devices, and other storage devices.

uC Core 148 along with Command Queue 144 interprets the command set and issues memory commands. An internal controller handles the operational timings and verifies the correct execution of the memory commands such as, for example, write commands, read commands, and flush commands. Additionally, a host of commands such as "status read", "copy", "move", or "error-correct" may be supported in this architecture. The controller supplies a Status Block 146 whose registers convey information about the status and report on any errors that may occur during memory operations. The status register output may be read to monitor the progress during command operations or report the result of the memory operations.

A buffer memory 142 holds several words that may be transferred as a group into a memory block 140 upon issuing the programming command and also buffers a large quantity of data read from the memory block. In this fashion one page is programmed, and after the program and verify processes are complete, the program and verify processes for a next page may be executed. A read command executes to read data from the memory cells to the buffer memory that is then transferred out. It should be noted that programming may start prior to transferring all of the data across the host interface. As will be more evident from the hierarchical structure illustrated in FIG. 2, data may propagate down through the hierarchy with some level of buffering until a sufficient amount of information is transferred to the target for programming to commence.

Memory block 140 may have a multiple bank architecture to provide flexibility for splitting the code and data spaces within the memory arrays. The dual operations allow code to be executed from one bank while the other bank is being programmed or erased. While programming or erasing in one bank, read operations are possible in the other bank. In one embodiment the memory arrays are Phase Change Memory (PCM) arrays, also referred to as Phase-Change Random Access Memory (PRAM or PCRAM), Ovonic Unified Memory (OUM) or Chalcogenide Random Access Memory (C-RAM). In another embodiment the memory arrays may be Magnetic Random Access Memory (MRAM) cells where magnetic storage elements are formed from two ferromagnetic plates (not shown) located at an intersection of a row and column line and selected by a Magnetic Tunnel Junction (MTJ) device (not shown). In yet another embodiment the memory arrays may be Ferroelectric Random Access Memory (FRAM) cells.

Hierarchical memory device 100 may include host interface logic that is integrated into the hierarchical memory device. The host interface logic may perform some or all of the following functions: communication with the host processor; aggregate multiple trees of hierarchical memory; wear leveling, retirement of bad memory sectors, provide statistical tracking of memory usage for performance and reliability management, and utilize content addressable memory in the hierarchical memory tree.

A block labeled Address & Sector Translation 110 presents the addressing within hierarchical memory device 100 by receiving the address information through bus 104 that may be used to access the memory devices attached at various locations in the hierarchy. When NAND address information is received by hierarchical memory device 100, address remapping may or may not occur as it passes through the hierarchy tree. Hierarchical memory device 100 knows the types of memory devices that are attached via a discovery process and an internal lookup table associates 'long' addresses to 'short' addresses. The long addresses include a complete roadmap to the target port such as, for example, a '0' may represent the port on the left and a '1' may represent the port on the right. The short addresses may be used for inter-device communication and include a sequential list of valid ports for the lower tree.

Wear Leveling 112 spreads erases across managed memory blocks and forces blocks with low cycle counts to occasionally move, and allows high cycled data to be placed in low cycled blocks. The majority of blocks do not cycle, but high cycle count blocks are most likely to fail and wear leveling hardware and microcode swaps addresses of high cycle count blocks with low cycle count blocks during the erase algorithm. Note that all address swapping is transparent to the end-user.

A configurable Error-Correcting Code (ECC) Engine 114 provides error detection and correction schemes. Error detection and correction schemes compensate for problems associated with writing accuracy and repeatability. Error-correcting code ensures that each data signal conforms to specific rules of construction and that departures from this construction in the received signal may be automatically detected and corrected. Thus, configurable ECC Engine 114 monitors, fixes, and prevents memory bit errors.

A compression & decompression block 116 provides compression of an input data set to a stored data set that occupies fewer bits of memory. When the stored data is accessed, it is decompressed and given back to the host. It should be noted that compression may be lossless such that the data read is guaranteed to be the same as the data that was written. On the other hand, lossy compression results in higher levels of compression but there may be changes in the data. Lossy compression may be appropriate for storage of video data where small changes in the data pattern wouldn't result in a significant degradation in user experience.

A caching management block 118 operates within the hierarchical memory tree(s) to provide optimization of information storage locations based on access patterns, e.g., stores 'hot' data in highest performance, most robust memory; and stores 'cold' data in less expensive, lower performance, less robust memory.

A data manipulation block 152 advantageously spends background time preconditioning sections of the memory that have a slower state such that these states can be quickly transitioned during foreground operations. It is often the case that it takes longer to write to a memory state that is store a state of '1' than to store a state of '0'. In these cases, the advantage to manipulating data is that there are fewer bits transitioning to the slower state. In these cases where the data is manipulated to invert the data, an additional bit is stored to indicate that the data has been inverted to optimize performance. Similar scenarios exist with the management of reliability (e.g. higher bit error rate for '1's than for '1's) for which similar techniques may be used.

A memory partitioning management block 120 may provide memory partitioning options to protect memory across different cores and partitions while maintaining software reusability, system reliability, and design flexibility. Partitioning permits the upper software layers which make use of the nonvolatile media to segment the available memory space to store different types of data or code. Hierarchical memory device 100 provides the possibility of partitioning the logical addressable space to adapt the device to different usage models and to changes of the usage models themselves during the system lifecycle.

Figure 2:
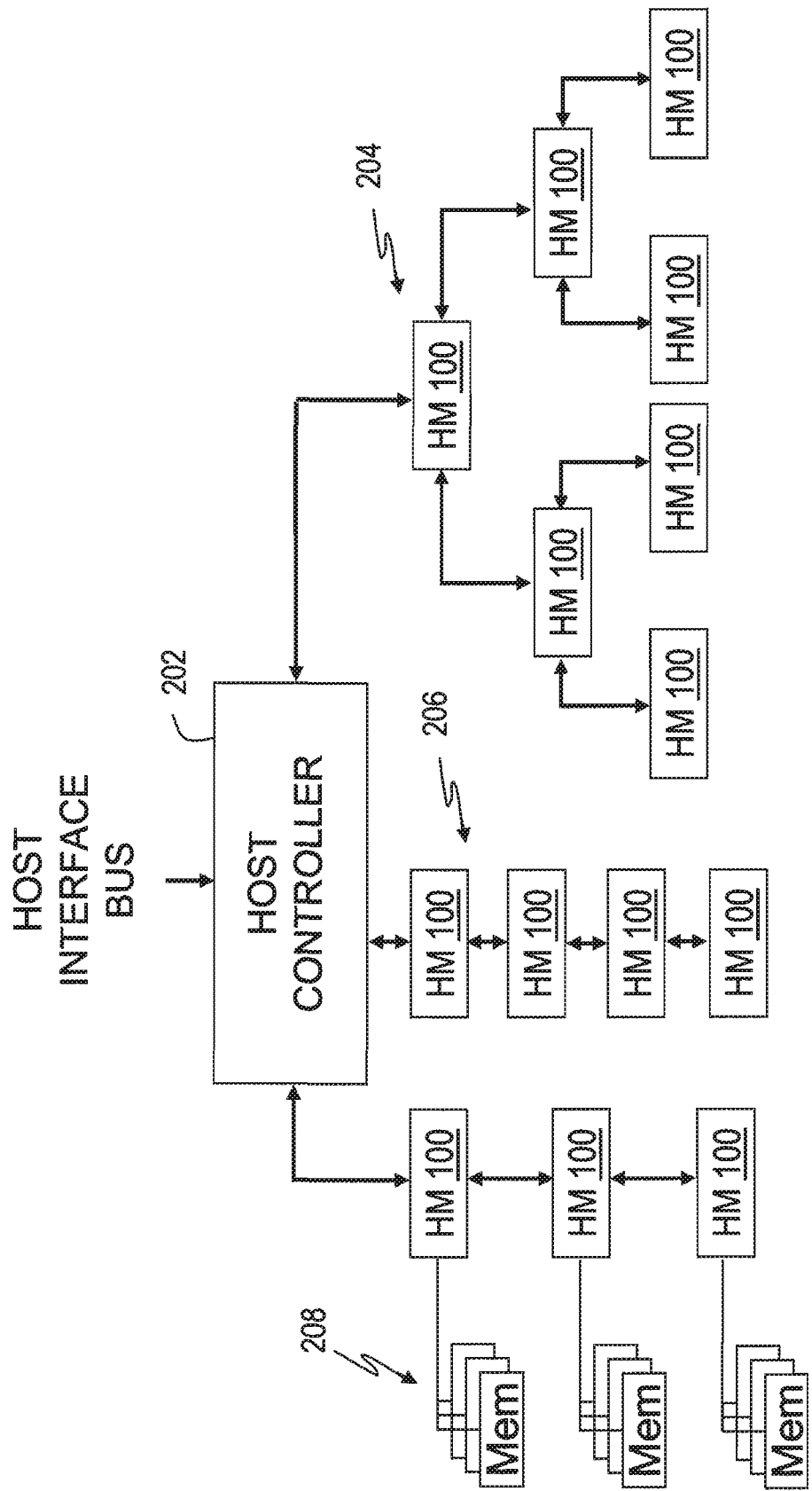
FIG. 2 is a schematic representation of various hierarchical memory configurations in accordance with the present invention.

FIG. 2 illustrates multiple hierarchical memory devices 100 connected in a variety of configurations with additional memory storage. The figure shows that properly arranged device(s) 100 allow a succession of memory devices and enable attachment of a memory depth to a processor controller with a limited pin count. Hierarchical memory device(s) 100 open the system mass memory storage and make possible a hierarchical memory architecture with a memory capacity limited mainly by practical physical constraints.

To provide higher total I/O bandwidth for short link communications, the inter-chip busses may be bidirectional, i.e., the busses may be independent busses with one bus providing signals in an up direction and one bus providing signals in a down direction. In addition to the simultaneous bidirectional signaling, Low Voltage Differential Signaling (LVDS) may be used as a signaling protocol for the inter-chip communication and for linking to LVDS memories for Universal Flash Storage (UFS).

Hierarchical memory device 100 sits between a processor and the memory storage devices that may have different storage mechanisms and different interface formats. Hierarchical memory device 100 provides an interface to accommodate the different memory formats such as, for example, NOR having random-access reading, NAND providing page accesses, and RAM allowing DDR. Hierarchical memory 100 may be attached to a host controller 202, or in an alternate embodiment may attach directly to the host should storage controller function(s) be integrated into memory device 100.

The figure shows hierarchical memory devices connected in a tree hierarchy 204 where each hierarchical memory device 100 switches traffic between its upstream port and one of N downstream ports. This configuration minimizes the round-trip latency to the lowest layer of the tree at the cost of some additional interconnects. The figure also shows hierarchical memory devices 100 connected in a daisy-chain 206. In the daisy-chain hierarchy each node interprets traffic to determine whether that traffic is for the local node or for a downstream/upstream node. Traffic intended for the local node is acted upon by taking the appropriate actions while downstream/upstream traffic is passed through the hierarchical memory device with a minimum latency. Additionally, hybrid configurations may combine different variations of hierarchies. For example, it may be advantageous to build a three layer tree with four terminal nodes with a 16-device deep daisy-chain attached to each terminal node.

In the hierarchical memory subsystem, standard non-hierarchical memory devices 208 may be attached to hierarchical memory devices 100. For example, Multi-Level Cell (MLC) NAND memory may be attached to a tree of hierarchical PCM memory. In this example, PCM may be used to facilitate connection of very large densities of NAND while also serving to reduce the stress conditions on the NAND memory by caching reads and coalescing/caching writes. Although the NAND memory is infrequently read and relatively infrequently written, writes to the NAND memory may be coalesced such that the only writes that occur comprise writing complete blocks of data. Using PCM for caching in hierarchical memory device 100 instead of volatile RAM simplifies the power loss recovery issues and prevents loss of data. The PCM memory may also perform ECC such that NAND write errors are not accumulated through multiple write operation.

Regardless of the host interface, there are multiple ways in which the hierarchical memory subsystem may logically appear to the system. Among these methods are IO mapped, memory mapped, and memory mapped IO. As an IO mapped device, the subsystem appears to the host and host software as a sector based device. In this type of device, all conversions and mappings such as the sectors-to-pages mapping are handled by the host. Generally, information is in atomic sectors that may be, for example, between 512 bytes to 8 kilobytes or larger in length. Generally, the IO mapped devices are handled through IO device drivers which induce an additional software latency to whatever hardware latency exists in the subsystem and associated interfaces.

As a memory mapped device, the subsystem appears to the host and host software as a flat memory map. Generally, memory mapped devices are accessed directly as memory eliminating operating system latencies. Similar to the IO Mapped interface, the subsystem appears to the host and host software as a sector based device. In addition, hierarchical memory device 100 can act as a memory mapped device. The memory mapped access can help eliminate the IO device drivers and controller logic delays.

Figure 3:
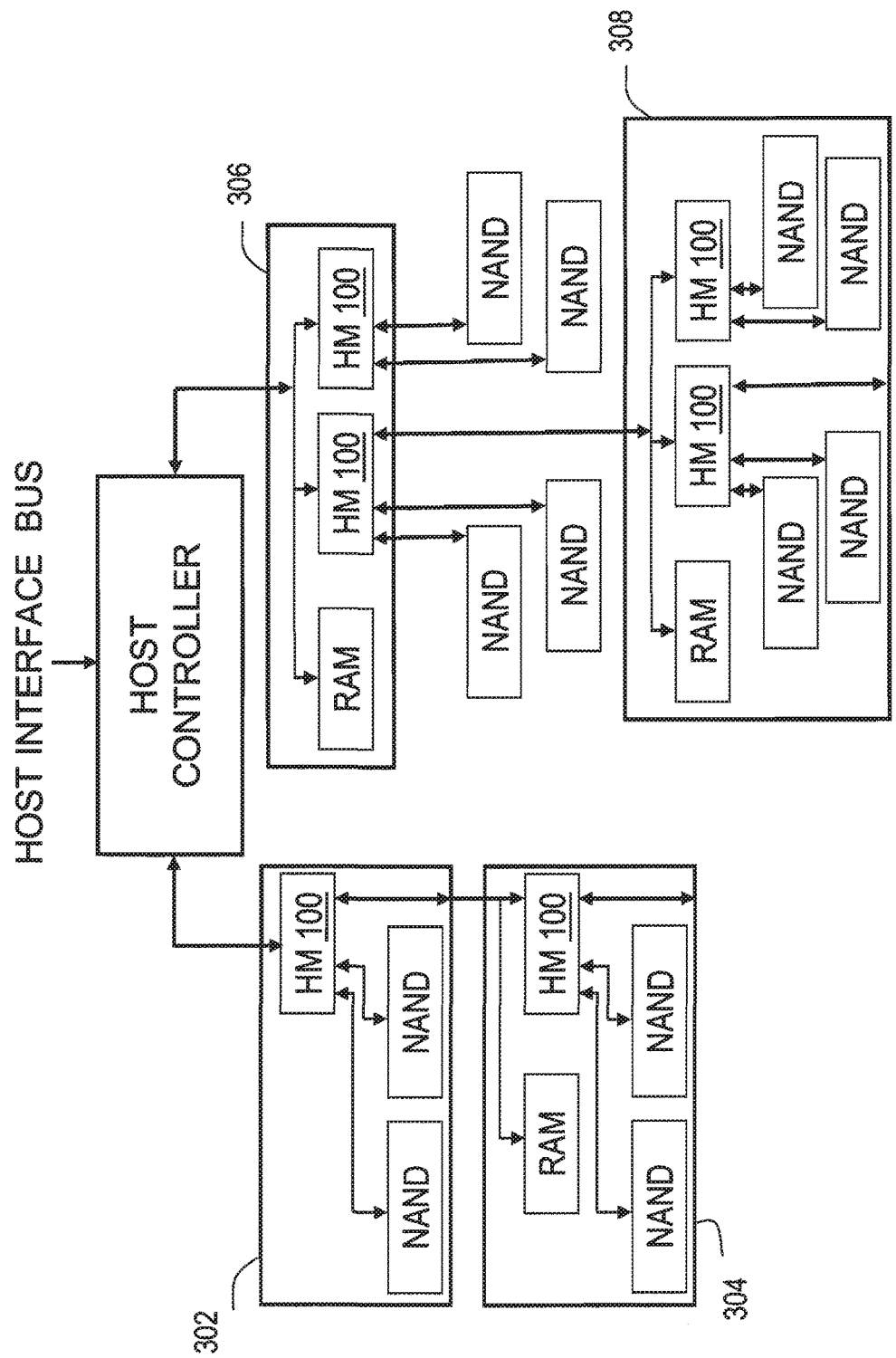
FIG. 3 illustrates the hierarchical memory configured with NAND and RAM in various combinations in accordance with the present invention.

FIG. 3 illustrates a hierarchical memory 100 combined with non-volatile memory in various configurations in accordance with the present invention. In package 302 the output ports of hierarchical memory 100 connect two NAND memory dice to provide a memory combination having particular utility in a Solid-State Drive (SSD) design. A SSD data storage device uses solid-state memory to store persistent data, where the density of the SSD may be increased by adding NAND memory using multiple packages 302. Also shown in the figure is a package 304 that incorporates a hierarchical memory 100 with a RAM on the same bus where two NAND memory dice are connected to the output ports on the backside of hierarchical memory 100.

A package 306 shows at least two hierarchical memory dice and a RAM coupled together on the frontside and providing several backside NAND ports to which dense NAND stacks may be attached as shown. Alternatively, package 308 illustrates that two or more hierarchical memory dice, one or more RAM, and dense NAND stacks that are attached to the hierarchical memory NAND ports may be combined.

Figure 4:
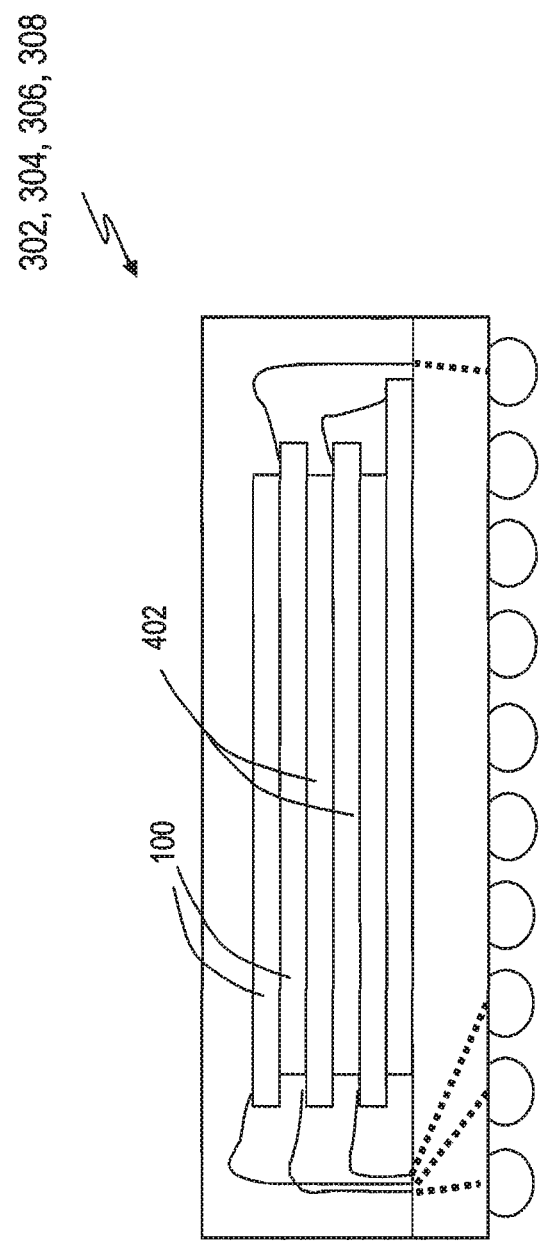
FIG. 4 illustrates packaged devices may mount the dice on a substrate which may then be bumped to create either a Chip Scale Package (CSP) or a Ball Grid Array (BOA) as the final package.

FIG. 4 illustrates packages 302, 304, 306 and 308 that mount the dice on a substrate which may then be bumped to create either a Chip Scale Package (CSP) or a Ball Grid Array (BGA) as the final package. Dice may be placed side-by-side on the substrate or die stacking techniques may be used to mount smaller dies onto larger ones to enable wire bonding of both. To aid interconnect, the dice may include thru-silicon vias and die-to-die bonding. In the embodiment illustrated in the figure, two hierarchical memory devices 100 are included with a stack of NAND devices 402. A RAM dice may also be included in the stack. To further increase the memory density and memory bandwidth available in a given size footprint, Package-on-Package (PoP) may be utilized to vertically connect multiple packages such as NAND stack packages with the hierarchical memory.

By now it should be apparent that embodiments of the present invention allow increased memory storage efficiencies through hierarchical data storage by using features of the present invention. By providing the hierarchical memory device with a host interface these devices may be connected to a host system. Within the hierarchical structure and storage controller, a number of algorithms such as wear leveling; caching; error detection and correction; bad page management, bad block management; and data manipulation to manage performance and reliability and provide the optimal storage capacity for the memory hierarchy. Thus, a hierarchical memory architecture is provided by incorporating one or more hierarchical memory devices in a memory storage system.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A hierarchical memory device, comprising:
   at least one input port; and
   multiple output ports, the hierarchical memory device being configured to be simultaneously connectable in both a daisy-chain hierarchy and a hierarchical tree structure with other hierarchical memory devices, the hierarchical memory device being configured to switch traffic between the at least one input port and at least one of the multiple output ports to reduce a round-trip latency to a lowest layer of the hierarchical tree structure.

2. The hierarchical memory device of claim 1, further comprising at least one processor core to perform multi-core memory management and autonomous computing functions, the memory management functions being configured to adjust data input/output between at least one memory interface and a buffer memory coupled to the at least one memory interface based on extracted control and operational information.

3. The hierarchical memory device of claim 2, wherein the at least one processor is further to execute algorithms for wear leveling, caching, error detection and correction, and data manipulation to precondition sections of memory having a slower state to manage performance and reliability.

4. The hierarchical memory device of claim 2, wherein the extracted control and operational information includes received command sets and addresses of memory devices coupled to the hierarchical memory device, the at least one processor further to interpret the received command sets and issue memory commands.

5. The hierarchical memory device of claim 2, wherein the at least one input port and the multiple output ports are configurable by the at least one processor core.

6. The hierarchical memory device of claim 1, further comprising a host logic interface to aggregate multiple trees within the daisy-chain hierarchy and the hierarchical tree structure.

7. The hierarchical memory device of claim 1, further comprising a caching management block to optimize information storage locations based on access patterns.

8. The hierarchical memory device of claim 1, further co sing a data manipulation block to invert data to increase writing performance.

9. A memory device, comprising:
at least one input port;
a number of output ports, the memory device being configured to simultaneously be connectable in both a daisy-chain hierarchy and a hierarchical tree structure with other memory devices; and
a number of interfaces having different memory formats, the number of interfaces including a NAND interface and a mass storage device interface.

10. The memory device of claim 9, further comprising at least one processor core configured to operate the memory device as at least one type of device selected from device types including an IO mapped, a memory mapped, and a memory-mapped IO device.

11. The memory device of claim 10, wherein the at least one processor core is further configured to interpret traffic in the daisy-chain hierarchy to determine whether the traffic is for the memory device or for a downstream/upstream node.

12. The memory device of claim 9, wherein the at least one processor core is further configured to activate security to regulate access requests to contents of the other memory devices.

13. The memory device of claim 9, further comprising a network interface to adjust signaling rates and receive or transmit data packet transmissions over communication links to and from the at least one memory device.

14. A hierarchical memory device, comprising:
a non-volatile memory array;
at least one input port and multiple output ports, the multiple output ports being configured to be connectable as at least one type of hierarchy selectable from hierarchies including a daisy-chain hierarchy and a hierarchical tree structure with other hierarchical memory devices; and
a memory interface configured to control communications between the non-volatile memory array and memory external to the hierarchical memory device such that the non-volatile memory array can cache data received from the external memory, the hierarchical memory device being configured to switch traffic between the at least one input port and one of the multiple output ports to reduce a round-trip latency to a lowest layer of the hierarchical tree structure.

15. The hierarchical memory device of claim 14, further comprising a multiple bank architecture to allow splitting code and data spaces within the non-volatile memory array.

16. The hierarchical memory device of claim 14, wherein the memory interface circuit is configured to operate selectively at increasingly higher multiples of a fundamental read rate.

17. The hierarchical memory device of claim 14, further comprising a host interface logic device to aggregate multiple trees of the other hierarchical memory devices.

18. The hierarchical memory device of claim 17, wherein the host interface logic device is further configured to receive addressing information from a bus coupled to the memory device and use the addressing information to access various ones of the other hierarchical memory devices.

19. The hierarchical memory device of claim 14, further comprising a network interface to support signaling rates and data packet transmissions over communication links, the network interface the network interface being configured to support an Ethernet protocol.

20. The hierarchical memory device of claim 14, further comprising:
storage controller logic to identify and adjust storage accesses; and
a buffer memory to program and verify processes.

* * * * *